United States Patent
Tamaru et al.

(10) Patent No.: US 10,432,144 B2
(45) Date of Patent: Oct. 1, 2019

(54) HIGH-FREQUENCY PHASE-LOCKED OSCILLATION CIRCUIT

(71) Applicant: National Institute of Advanced Industrial Science and Technology, Tokyo (JP)

(72) Inventors: Shingo Tamaru, Tsukuba (JP); Hitoshi Kubota, Tsukuba (JP); Akio Fukushima, Tsukuba (JP); Shinji Yuasa, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 63 days.

(21) Appl. No.: 15/569,500

(22) PCT Filed: Apr. 27, 2016

(86) PCT No.: PCT/JP2016/063237
§ 371 (c)(1),
(2) Date: Oct. 26, 2017

(87) PCT Pub. No.: WO2016/175249
PCT Pub. Date: Nov. 3, 2016

(65) Prior Publication Data
US 2018/0302035 A1    Oct. 18, 2018

(30) Foreign Application Priority Data

Apr. 30, 2015    (JP) ................. 2015-093384

(51) Int. Cl.
*H03B 15/00* (2006.01)
*H01L 43/08* (2006.01)
(Continued)

(52) U.S. Cl.
CPC ....... *H03B 15/006* (2013.01); *H01F 10/3259* (2013.01); *H01L 29/82* (2013.01);
(Continued)

(58) Field of Classification Search
CPC ....... H03B 15/006; H03L 7/099; H03L 7/093; H03L 7/18; H01F 10/3259; H01L 43/08
See application file for complete search history.

(56) References Cited

U.S. PATENT DOCUMENTS

| | | | |
|---|---|---|---|
| 8,610,512 B2 * | 12/2013 | Michel | ................. H03B 15/006 257/421 |
| 2008/0150643 A1 | 6/2008 | Suzuki et al. | |
| 2013/0057357 A1 | 3/2013 | Houssameddine et al. | |

FOREIGN PATENT DOCUMENTS

| JP | 2006-295908 A | 10/2006 |
|---|---|---|
| JP | 2007-221764 A | 8/2007 |
| KR | 101284687 B1 | 7/2013 |

OTHER PUBLICATIONS

Villard et al., "A GHz Spintronic-Based RF Oscillator," IEEE Journal of Solid-State Circuits, vol. 45, No. 1, pp. 214-223 (Jan. 2010).
(Continued)

*Primary Examiner* — Ryan Johnson
(74) *Attorney, Agent, or Firm* — McCormick, Paulding & Huber LLP (57) ABSTRACT

A high-frequency phase-locked oscillation circuit having an extremely narrow peak width and a stable frequency so that a high-frequency wave that is oscillated by the MR element solves a problem of a large peak width of oscillation spectrum. The high-frequency phase-locked oscillation circuit includes a magnetoresistive element that oscillates a high-frequency wave with an oscillating frequency; a reference signal source that outputs a reference signal with a reference frequency; a phase-locked loop circuit having a
(Continued)

phase comparator, a loop filter, and a frequency divider; an adder that adds a phase error signal output from the loop filter and a bias voltage for oscillating the high-frequency wave from the magnetoresistive element, and that inputs an added bias voltage to the magnetoresistive element; and a filter provided between the frequency divider and the magnetoresistive element.

6 Claims, 10 Drawing Sheets

(51) Int. Cl.
    *H01L 29/82*     (2006.01)
    *H03L 7/099*     (2006.01)
    *H01F 10/32*     (2006.01)
    *H01L 43/02*     (2006.01)
    *H03L 7/093*     (2006.01)
    *H01L 43/10*     (2006.01)
    *H03L 7/18*     (2006.01)
(52) U.S. Cl.
    CPC .............. *H01L 43/02* (2013.01); *H01L 43/08* (2013.01); *H03B 15/00* (2013.01); *H03L 7/093* (2013.01); *H03L 7/099* (2013.01); *H01L 43/10* (2013.01); *H03L 7/18* (2013.01)

(56) References Cited

OTHER PUBLICATIONS

Supplementary European Search Report for Serial No. EP 16 78 6525 dated Nov. 12, 2018.
International Search Report for PCT Serial No. PCT/JP2016/063237 dated Jul. 1, 2016.
H.Kubota, K.Yakushiji, A.Fukushima, S.Tamaru, M.Konoto, T.Nozaki, S.Ishibashi, T.Saruya, S.Yuasa, T.Taniguchi, H.Arai, and H.Irnamura: Applied Physics Express 6 (2013) 103003 : Topological insulators in Bi2Se3, Bi2Te3 and Sb2Te3 with a single Dirac cone on the surface; H. Zhang et al., Nature Physics, 5, 438 (2009).
H.Maehara, H.Kubota, Y.Suzuki, T.Seki, K.Nishimura, Y.Nagamine, K.Tsunekawa, A.Fukushima, A.M.Deac, K.Ando and S.Yuasa: Applied Physics Express 6 (2013) 113005.
Tingsu Chen, Spin Torque Oscillator-based Integrated Solutions for Magnetic Field Sensing and Wireless Communication Applications, 21st IEEE International Conference on Electronics, Circuits and Systems (ICECS), 2014, IEEE, Dec. 7, 2014.

\* cited by examiner

HIGH-FREQUENCY PHASE-LOCKED OSCILLATION CIRCUIT

CROSS-REFERENCE TO RELATED APPLICATIONS

This application is a National Stage application of International Patent Application No. PCT/JP2016/063237, filed on Apr. 27, 2016, which claims priority to Japanese Patent Application Number 2015-093384, filed on Apr. 30, 2015, each of which is hereby incorporated by reference in its entirety.

TECHNICAL FIELD

The present invention relates to a high-frequency phase-locked oscillation circuit that uses a magnetoresistive element and that has a narrow peak width. This circuit is applicable to communication equipment, etc.

BACKGROUND ART

A communication technology using a high frequency (about 100 MHz to 200 GHz) including microwave (about 1 GHz to 200 GHz) has become important in recent years, and the technology is applied widely to cellular phones, wireless communications, satellite broadcasting, in-vehicle radars, etc.

Figure 15:
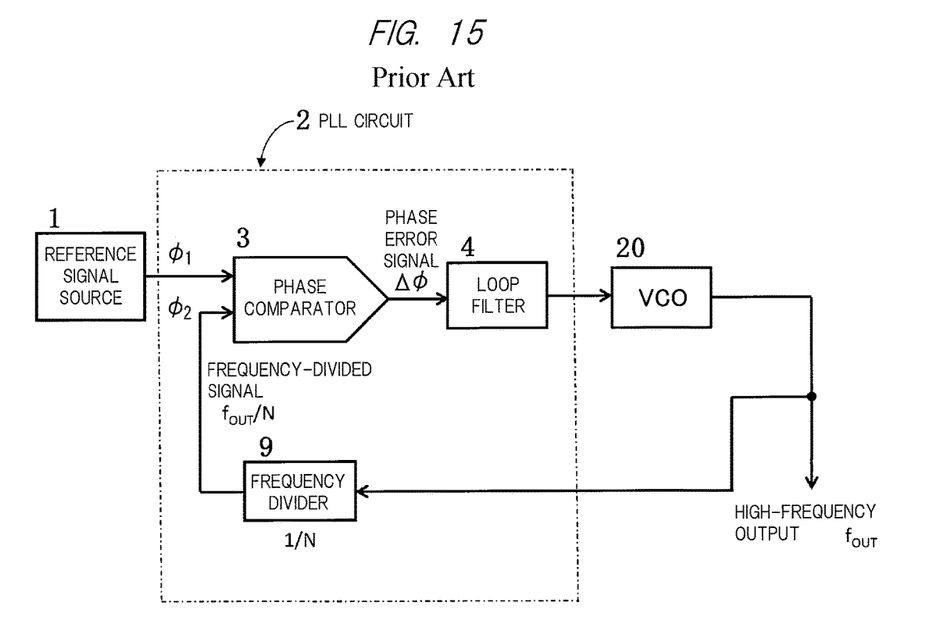
FIG. 15 is a circuit diagram of a conventional high-frequency phase-locked oscillation circuit.

Currently, a phase-locked oscillation circuit is widely used for high-frequency oscillation. FIG. 15 shows a conventional phase-locked oscillation circuit. Briefly speaking, the phase-locked oscillation circuit of FIG. 15 is configured of a VCO (Voltage-Controlled Oscillator) 20 and a phase-locked loop circuit 2 (which will hereinafter be referred to as "PLL circuit"). The VCO has a disadvantage that is an unstable oscillating frequency $f_{out}$ (temporal change in a phase). Because of the unstable oscillating frequency, an oscillation spectrum is not narrowed and sharped but wide. That is, a peak of the spectrum is broad. Therefore, the PLL circuit 2 is provided in order to narrow the peak width, in other words, to achieve the phase synchronization. Basically, the PLL circuit 2 is configured of a reference signal source 1 that outputs a reference signal with a frequency $f_{ref}$, a phase comparator 3, a loop filter 4, and a frequency divider 9. An output from the phase comparator of the PLL circuit (which will hereinafter be referred to as "phase error signal") achieves the phase synchronization.

However, the VCO includes a coil and a capacitor as its components when the oscillating frequency is low while including a dielectric resonator as its component when the oscillating frequency is high, and therefore, it is difficult to downsize the VCO (into an IC package). Therefore, in order to achieve the downsizing, it has been suggested that a magnetoresistive element (which will hereinafter be referred to as "MR element") is configured to be a high-frequency oscillation source. For example, MR elements described in Japanese Patent Application Laid-open Publication No. 2006-295908 and H. Kubota, K. Yakushiji, A. Fukushima, S. Tamaru, M. Konoto, T. Nozaki, S. Ishibashi, T. Saruya, S. Yuasa, T. Taniguchi, H. Arai, and H. Imamura: Applied Physics Express 6 (2013) 103003 and H. Maehara, H. Kubota, Y. Suzuki, T. Seki, K. Nishimura, Y. Nagamine, K. Tsunekawa, A. Fukushima, A. M. Deac, K. Ando and S. Yuasa: Applied Physics Express 6 (2013) 113005 match the suggestion. The MR element can be manufactured by a semiconductor manufacturing process. Therefore, a small-sized element having a size of "(about 30 nm to 300 nm in diameter)×(about 30 nm to 100 nm in height)" can be manufactured.

Basically, the MR element has a magnetization flexible layer (which will hereinafter be referred to simply as "free layer"), a non-magnetic layer, and a magnetization fixed layer (which will hereinafter be referred to simply as "fixed layer"). When a direct current is caused to flow in a direction from the free layer to the fixed layer or in a direction reverse to that direction, electron spins in the free layer are excited by a spin torque of the direct current, and the electrons are oscillated at a frequency that is unique to the free layer, so that a high-frequency wave (microwave) is oscillated. However, this high-frequency wave oscillated by the MR element has a first problem that is the unstable oscillating frequency $f_{out}$ (large peak width) as similar to the case of the VCO.

SUMMARY

In order to solve the first problem, the present inventors have manufactured a high-frequency phase-locked oscillation circuit on trial in combination of the MR element with the PLL circuit as similar to the case of the VCO, and experiment on the high-frequency phase-locked oscillation circuit has been conducted. However, the PLL circuit has not functioned at all. An object of the present invention is to solve this problem (second problem) that does not function the PLL circuit.

The present inventors have diligently studied what is a cause of the second problem. Essentially, the high-frequency (fundamental, high harmonic) oscillating frequency $f_{out}$ generated by the MR element is input to the frequency divider of the PLL circuit. However, as a result of the diligent studies, the present inventors have found that the cause is the input of "the reference signal with the frequency $f_{ref}$" to the frequency divider of the PLL circuit. Thus, the present inventors have set a filter at a stage before the frequency divider in order to cut off the harmful frequency $f_{ref}$ and input the essential oscillating frequency $f_{out}$. As a result of this, the second problem has been resolved to narrow the peak width, so that this finding has led to the present invention.

In order to achieve the above-described object, the present invention has the following features.

A high-frequency phase-locked oscillation circuit according to the present invention is a high-frequency phase-locked oscillation circuit including: a magnetoresistive element that oscillates a high-frequency wave with an oscillating frequency $f_{out}$; a reference signal source that outputs a reference signal with a reference frequency $f_{ref}$; and a phase-locked loop circuit having a phase comparator, a loop filer, and a frequency divider. A feature of the high-frequency phase-locked oscillation circuit further is to provide an adder that adds a voltage A that is output from the loop filter and a bias voltage B, the voltage A corresponding to a phase error signal, the voltage B being used for oscillating the high-frequency wave from the magnetoresistive element, and that inputs the added bias voltage (A+B) to the magnetoresistive element, and provide a filter provided between the frequency divider and the magnetoresistive element in a region closer to the input side of the frequency divider, the filter being used for cutting off the reference frequency $f_{ref}$ while allowing the oscillating frequency $f_{out}$ to pass through the filter. The oscillating frequency $f_{out}$ to be used may be a fundamental wave or high harmonic wave of the fundamental wave. When the high harmonic wave of the magnetoresistive element is used, the filter needs to be a filter that allows the high harmonic wave to pass therethrough while this filter may cut off the fundamental wave of the magnetoresistive element.

It is preferable to form the filter so as to cut off the fundamental wave and the high harmonic wave with the reference frequency fref. That is, while it is basically required to cut off the fundamental wave with the reference frequency fref by the filter, it is preferable to cut off not only the fundamental wave but also the high harmonic wave.

It is preferable to provide an output limit circuit in a region closer to either the output side of the loop filter or the output side of the adder.

A low-pass filter may be provided in a region closer to the output side of the adder, the region being also closer to the input side of the magnetoresistive element. An amplifier may be provided at a stage before the sending of the signal to the frequency divider in order to amplify a high-frequency signal oscillated from the magnetoresistive element, and a second filter may be provided between the output side of the amplifier and the input side of the frequency divider, the second filter allowing only the oscillating frequency $f_{out}$ oscillated from the magnetoresistive element to pass through the filter.

In a high-frequency phase-locked oscillation circuit using a magnetoresistive element, the present invention offers an effect that causes a narrowed and sharped oscillation spectrum of an oscillating frequency $f_{out}$ to narrow a peak width. This means a fact that the frequency is stable. Therefore, usage of the high-frequency phase-locked oscillation circuit of the present invention for communication offers an effect of, for example, enhancing a channel density.

DETAILED DESCRIPTION

Figure 1:
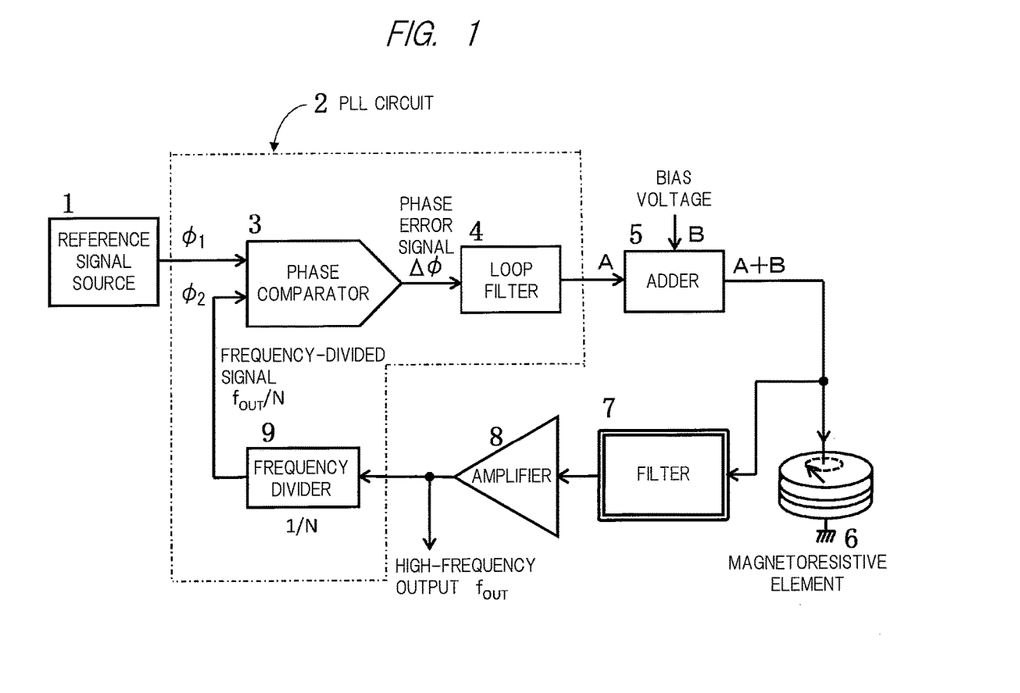
FIG. 1 is an example of a circuit diagram of a high-frequency phase-locked oscillation circuit according to the present invention.
Figure 2:
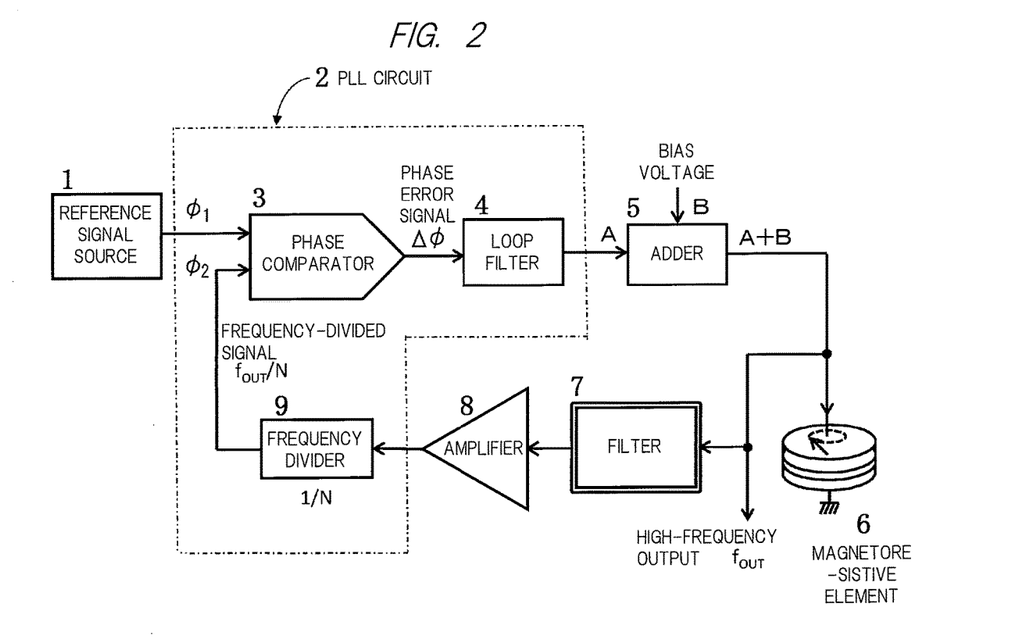
FIG. 2 is another example of the circuit diagram of the high-frequency phase-locked oscillation circuit according to the present invention.
Figure 3:
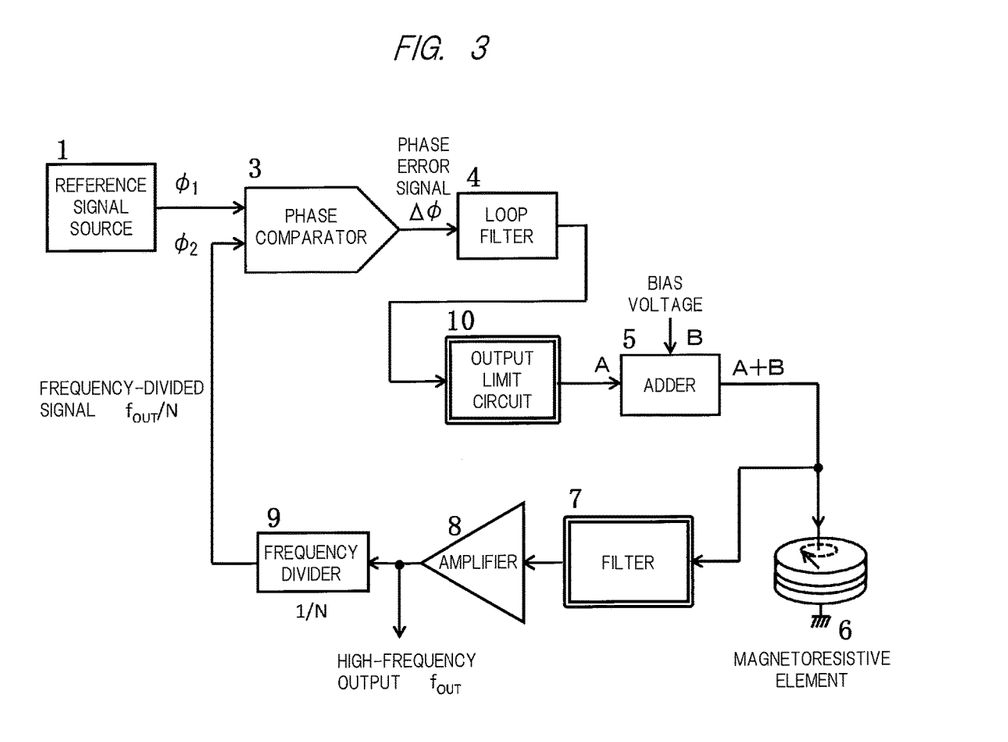
FIG. 3 is still another example of the circuit diagram of the high-frequency phase-locked oscillation circuit according to the present invention.
Figure 4:
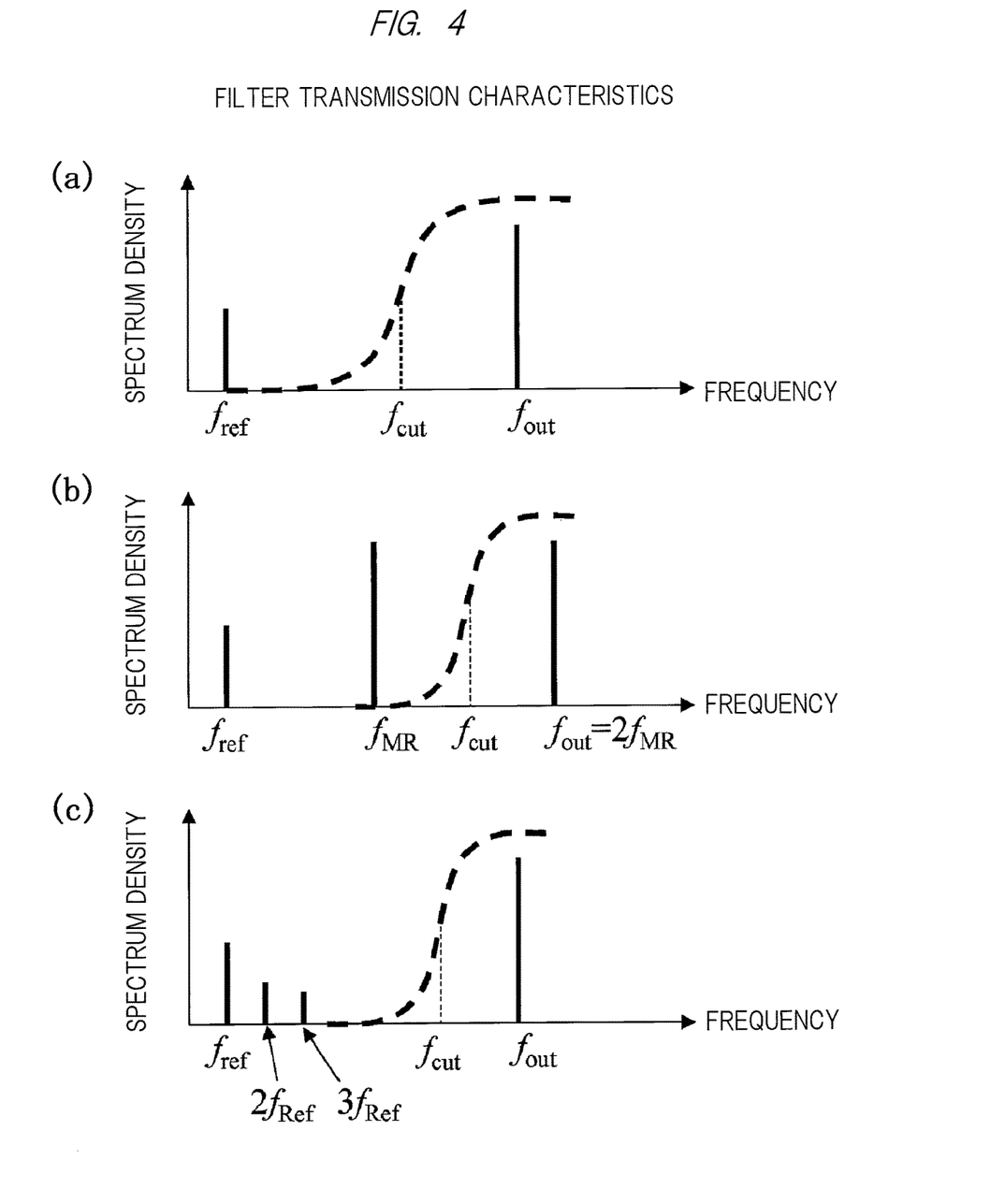
FIG. 4 is a diagram for conceptually explaining transmission characteristics of a filter used in the present invention.

A high-frequency phase-locked oscillation circuit according to the present invention will be described with reference to FIGS. 1 to 4. FIG. 1 is an example of a circuit diagram of a high-frequency phase-locked oscillation circuit according to an embodiment of the present invention. FIGS. 2 and 3 are modifications of the circuit diagram. FIG. 4 is a diagram for explaining transmission characteristics of a filter shown in the circuit diagram. The high-frequency phase-locked oscillation circuit according to the embodiment of the present invention includes a reference signal source 1, a phase-locked loop circuit 2, and a magnetoresistive element 6. The phase-locked loop circuit 2 includes a phase comparator 3, a loop filter 4, and a frequency divider 9. The high-frequency phase-locked oscillation circuit further includes an adder 5 that adds a voltage A that is output from the loop filter and a bias voltage B, the voltage A corresponding to a phase error signal, and includes a filter 7 provided in a region closer to the input side of the frequency divider. The high-frequency phase-locked oscillation circuit will be specifically described below.

<<MR Element>>

The MR element oscillates a high-frequency wave with an oscillating frequency $f_{out}$. At this time, the MR element oscillates not only a fundamental wave but also a high harmonic wave. Therefore, depending on the purpose of usage, the high harmonic wave may be used while the fundamental wave may be discarded. In the MR element, almost monotonous (linear) change in the oscillating frequency $f_{out}$ relative to the bias voltage is preferable within a phase synchronization operation range, and no change in the amplitude is preferable. While the MR elements are classified into a horizontal type and a vertical type depending on a magnetization direction, both types are applicable. Basically, the MR element has a free layer, a non-magnetic layer, and a fixed layer.

The free layer is made of a ferromagnetic material. As the ferromagnetic material, for example, an iron-based material or iron-based alloy containing Fe, Co, Ni, etc. (e.g., CoFeB) is a typical material. For example, a one-layer film made of FeB, a two-layer film made of CoFeB and NiFe, a two-layer film made of CoFe and NiFe, a three-layer film made of CoFeB, Ru, and CoFe, a three-layer film made of CoFeB, Ru, and NiFe, a three-layer film made of CoFe, Ru, and NiFe, a four-layer film made of CoFeB, CoFe, Ru, and CoFe, a four-layer film made of CoFeB, CoFe, Ru, and NiFe, and others are usable. The free layer preferably has a crystal structure such as BCC structure. The free layer has a thickness of, for example, about 1.5 to 10 nm.

Materials of the non-magnetic layer are classified into (1) a non-magnetic metal (GMR element) or (2) an insulator (TMR element). In the case of the TMR element, the non-magnetic layer is referred to also as tunnel barrier layer. Specific examples will be described below.

(1) In the case of the non-magnetic metal, for example, Cu, Ag, Cr, etc., can be used. The non-magnetic layer has a thickness of, for example, about 0.3 nm to 10 nm. When Cu or Ag that achieves a large MR ratio is used, the thickness becomes, for example, 2 nm to 10 nm.

(2) In the case of the insulator, various dielectric materials such as oxides, nitrides, and halides of, for example, Mg, Al, Si, Ca, Li, etc., can be used. Particularly, it is preferable to use MgO (magnesium oxide) that achieves a large MR ratio and a small surface resistance. When the above-described oxide or nitride is used as the non-magnetic layer, some oxygen or nitrogen deficiencies can exist in the oxide or nitride. The non-magnetic layer has a thickness of, for example, about 0.3 nm to 2 nm.

The fixed layer is also made of a ferromagnetic material. As the ferromagnetic material, for example, an iron-based material or iron-based alloy containing Fe, Co, Ni, etc. (e.g., FeB or CoFeB) is a typical material. If an amorphous state is desired as an intermediate state for convenience in a manufacturing method, alloys as CoFeBSi, CoFeBTi, CoFeBCr, and CoFeBV created by adding B (boron), Si, Ti, Cr, V, etc., to the above-described materials can be also used. Particularly in the case of perpendicular magnetization, such alloys as CoPt, CoPd, FePt, and FePd, alloys created by adding B, Cr, etc., to the former alloys, or a multi-layer film composed of thin films of these alloys can be used. The fixed layer preferably has a crystal structure such as BCC structure. A film in an amorphous state may be crystallized by, for example, a heat process (annealing).

The thickness of the fixed layer will be described. Decrease in the thickness of the fixed layer causes a problem that is reduction in the stability of the magnetization direction against an electric current and heat. Also, this causes another problem that is difficulty in formation of a continuous film. On the other hand, increase in the thickness of the fixed layer causes problems that are a large magnetic field leakage from the fixed layer to the free layer and difficulty in miniaturization. Therefore, the thickness of the fixed layer is generally, for example, about 2 nm to 30 nm.

The basic three layers, i.e., the free layer, non-magnetic layer, and fixed layer have been described above. However, in addition to these layers, an extraction electrode layer, a support layer that gives support for maintaining the magnetization direction of the fixed layer, a support layer that gives support for adjusting the easy magnetization direction of the free layer, a support layer (reading-dedicated layer) that gives support for enhancing a reading signal when the magnetization direction of the free layer is read, and layers such as a capping layer, may be added in some cases unless otherwise the layer is without the scope of the object of the present invention.

<<Reference Signal Source>>

The reference signal source is used for inputting the reference signal to the PLL circuit. The frequency $f_{ref}$ of the reference signal is, for example, about $½^3$ to $½^{10}$ of the frequency (oscillating frequency $f_{out}$) of the high-frequency wave oscillated by the MR element. For example, a crystal oscillator, ceramic oscillator, etc., having a frequency of 1 MHz to 100 MHz is used as the reference signal source.

<<PLL Circuit>>

The PLL circuit is basically configured of the phase comparator, the loop filter, and the frequency divider. The phase comparator compares the reference signal $f_{ref}$ from the reference signal source with a frequency-divided signal from the frequency divider in a phase, and outputs a phase error signal A to the loop filter. To the adder, the loop filter outputs a voltage corresponding to the phase error signal A. In general, the oscillating frequency $f_{out}$ is slightly changed by this voltage, so that the frequency is stabled. By this stability, the peak width is narrowed. The frequency divider is a device that reduces the frequency $f_{out}$ of the high-frequency wave output down to "1/N". A term "N" is referred to as a frequency division ratio. In the present invention, "N" can be any rational number (1 or larger in practical use) such as 16/3, 20/7, 33/5, 8, 16, 24, 48, 64, and 100. A frequency-divided signal ($f_{out}/N$) whose frequency has been reduced by the frequency divider is input to the phase comparator.

<<Adder>>

The adder adds an output voltage A from the loop filter and a bias voltage B. The bias voltage oscillates the high-frequency wave from the MR element, and the added voltage "A+B" is applied to the MR element.

<<Filter>>

The filter is one of features of the present invention. This filter cuts off the reference frequency $f_{ref}$ but allows the oscillating frequency $f_{out}$ of the high-frequency wave oscillated by the MR element to pass through the filter. However, not only a fundamental wave but also a high harmonic wave are included in the high-frequency wave oscillated by the MR element, and therefore, it is preferable to cut off the fundamental when the high harmonic wave is used because the fundamental wave is unnecessary.

The characteristics of the filter will be described further in detail with reference to FIG. 4. FIG. 4(a) shows an example of the basic transmission characteristics of the filter according to the present invention, and each of FIGS. 4(b) and 4(c) shows the transmission characteristics of the filter according to an application example. Generally, the filters are classified by a cutoff frequency $f_{cut}$. The cutoff frequency $f_{cut}$ of the filter used in the present invention is set between the reference frequency $f_{ref}$ and the oscillating frequency $f_{out}$. Since the purpose of this filter is to cut off the reference frequency $f_{ref}$ and allow the oscillating frequency $f_{out}$ to pass through the filter, a high-pass filter having the characteristics as shown in FIG. 4(a) can be used. Further, a band-pass filter that is set so as to cut off the reference frequency $f_{ref}$ and allow the oscillating frequency $f_{out}$ to pass through the filter can be also used. In the drawing, a continuous line indicates the peak positions of the spectra while a dotted line indicates the transmission characteristics of the filter.

Further, in the high-frequency oscillation circuit of the present invention, not the fundamental wave of the oscillating frequency of the MR element but the high harmonic wave of the same may be used and oscillated as the high-frequency wave. The phase locking to the high harmonic wave can be made by selecting the high harmonic wave of the magnetoresistive element as the oscillating frequency $f_{out}$ and setting the cutoff frequency $f_{cut}$ to be between the high harmonic wave and another high harmonic wave (fundamental wave in some cases) whose order is lower than the harmonic wave by one. FIG. 4(b) shows an example of a high harmonic wave having a twice frequency as the fundamental wave, and therefore, the oscillating frequency $f_{out}$ becomes $2f_{MR}$. Here, a term "$f_{MR}$" indicates a fundamental frequency of the oscillating frequency of the MR element. FIG. 4(b) is an example in which the cutoff frequency $f_{cut}$ is set between $2f_{MR}$ and $f_{MR}$.

Next, a case in which noises can cause in a high harmonic wave with the reference frequency $f_{ref}$ will be considered. In this case, as shown in FIG. 4(c), a large signal is generated at frequencies of $2f_{ref}$, $3f_{ref}$, etc. In such a case, the phase locking to the oscillating frequency $f_{out}$ can be made by setting the cutoff frequency $f_{cut}$ to be a larger frequency than the frequencies of $2f_{ref}$, $3f_{ref}$, etc. In this sense, it is preferable to largely separate the reference frequency $f_{ref}$ from the oscillation frequency $f_{out}$. In other words, when the frequency division ratio "N" of the frequency divider is 8 or larger, the reference frequency $f_{ref}$ and the oscillation frequency $f_{out}$ are easily separated from each other by the filter.

<<Amplifier>>

Since an intensity of a signal having passed through the filter may be low in some cases, an amplifier 8 (see FIGS. 1, 2, and 3) may be provided if needed. The signal amplified by the amplifier is input to the frequency divider. Generally, an amplitude of an output signal $f_{out}$ from the MR element is 10 mV (rms) or less that is extremely small. Note that "rsm" (root mean square) means an effective value. On the other hand, it is preferable to amplify an input signal to the frequency divider to be at least about 30 mV (rms) or larger since the frequency divider is a digital circuit. Therefore, it is preferable to provide a proper amplifier between the output signal of the MR element and the frequency divider. This amplifier may be provided at a stage either before or after the filter.

<<Extraction of High-Frequency Wave>>

It is required to transmit the output signal from the MR element to the PLL circuit, and besides, extract the output signal for the original usage purpose. A position at which the signal is extracted may be set to be any part between the MR element and the frequency divider depending on the usage purpose and convenience of the circuit configuration. FIG. 1 shows an example in which the filter is provided at a stage before the amplifier and in which the signal extraction position is provided at a stage after the amplifier. However, the high-frequency signal extraction position is flexible to some extent with respect to the arrangements of the amplifier and the filter as described above, and is not limited to the position in FIG. 1. FIG. 2 shows another example of the high-frequency phase-locked oscillation circuit. FIG. 2 shows an example in which the filter is provided in a region closer to the input side of the amplifier and in which the high-frequency signal extraction position is provided at a stage immediately after the output terminal of the MR element. The amplifier may be inserted at a stage either before or after the filter.

<<Output Limit Circuit>> an operating voltage (drive voltage=bias voltage) necessary for the high-frequency oscillation generally includes a voltage range that is unique to the MR element. In order to put the operating voltage within the voltage range, a circuit for adjusting the voltage may be provided if needed. Specifically, an output limit circuit 10 may be provided at the output of the filter or the output terminal of the adder. In this manner, a proper voltage is input to the MR element. FIG. 3 shows an example in which the output limit circuit 10 is provided at the output terminal of the loop filter 4. A lower limit of the voltage range is a critical voltage at which the element oscillates the high-frequency wave, and an upper limit of the same is a voltage at which the element is broken.

First Embodiment

Figure 5:
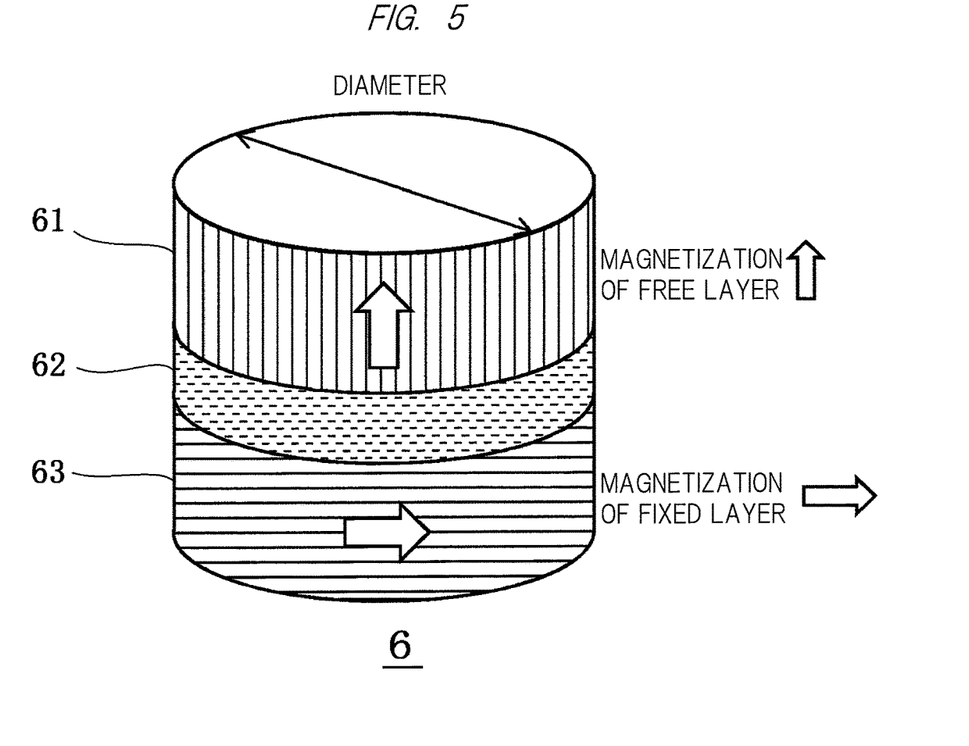
FIG. 5 is a perspective conceptual diagram of an MR element according to a first embodiment.

FIG. 5 is a schematic diagram showing the structure of the MR element used in the present embodiment. The structure is almost the same as the structure disclosed in Japanese Patent Application Laid-open Publication No. 2006-295908. The structure is basically a three-layer structure configured of a free layer 61, a tunnel barrier layer (non-magnetic layer) 62, and a fixed layer 63. The free layer 61 is a Feb layer (2 nm in thickness), the tunnel barrier layer 62 is a MgO layer (1 nm in thickness), and the fixed layer 63 is a multi-layer film made of "CoFeB (3 nm in thickness)/Ru (0.85 nm in thickness)/CoFe (2.5 nm in thickness)/PtMn (15 nm in thickness)". The CoFeB layer is in contact with the MgO layer. A laminated structure having the structure is formed first, and then, is shaped into a column having a diameter of 300 nm by a micro-process technique. This columnar-shaped body is the MR element. The MR element has a resistance value of 11Ω (ohm) and a magnetoresistive ratio (MR ratio) of about 30% under a room temperature.

Figure 6:
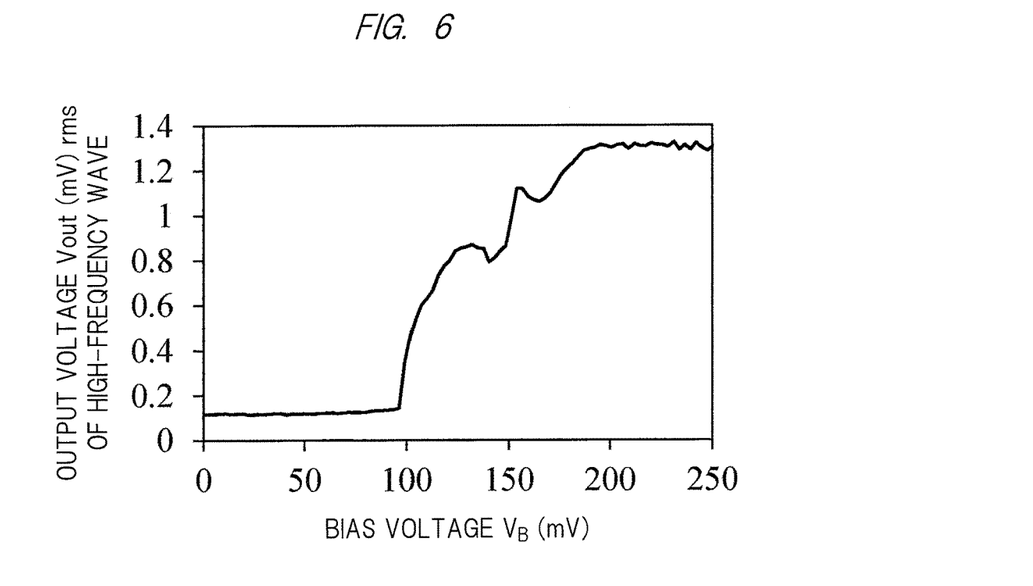
FIG. 6 is a diagram showing a change in an output voltage of a high-frequency wave relative to a bias voltage according to the first embodiment.

FIG. 6 shows a change in an oscillation output voltage $V_{out}$ of the high-frequency wave (with $f_{out}$) with respect to the bias voltage of the MR element. This element oscillates the high-frequency wave (with $f_{out}$) at the bias voltage of about 95 mV (critical voltage) or higher. The oscillation output is maximized at around 130 mV. The output voltage is saturated at a higher bias voltage. For the phase-locked oscillation, it is desired that the amplitude hardly changes with respect to the bias voltage. Therefore, next, the present inventors have studied changes in the amplitude and the frequency with respect to the bias voltage in vicinity of the above-described maximum point in detail.

Figure 7:
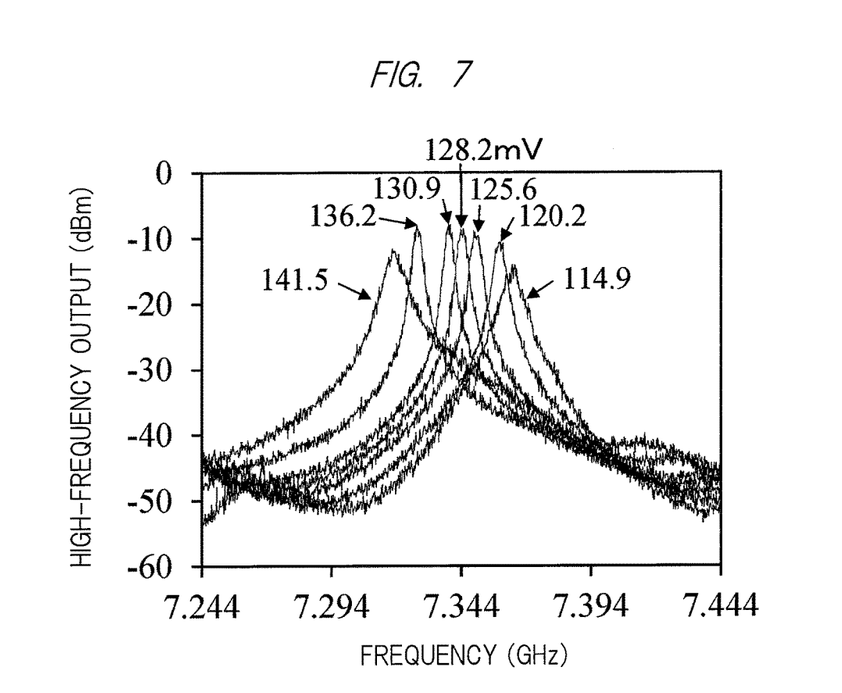
FIG. 7 is a diagram showing a change in oscillation spectra of a high-frequency wave relative to a bias voltage (mV) according to the first embodiment.

FIG. 7 shows the result of detailed measurement of the change in the oscillation spectra (waveforms) (particularly, the oscillating frequency $f_{out}$ and its size) of the MR element in the bias voltage range (around 130 mV) shown in FIG. 6. The MR element exhibits single-peaked oscillation spectra (waveforms) in a bias voltage range of 114.9 mV to 141.5 mV. The output amplitude of the single peak hardly changes.

Figure 8:
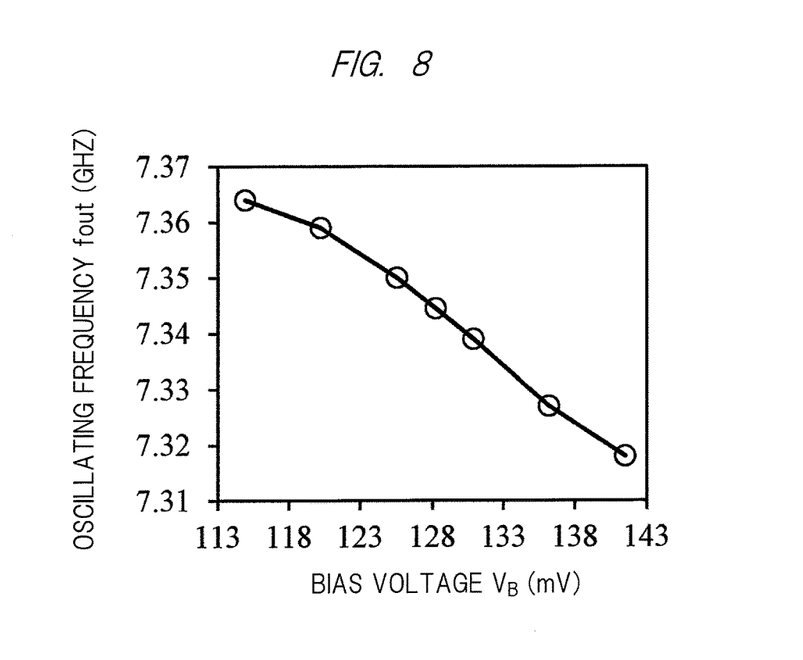
FIG. 8 is a diagram showing a change in an oscillation frequency $f_{out}$ relative to the bias voltage according to the first embodiment.

A graph of FIG. 8 is made from FIG. 7, and shows a change in the oscillating frequency $f_{out}$ (fundamental wave) of the MR element at around the bias voltage of 130 mV. In this manner, it is shown that the oscillating frequency $f_{out}$ changes almost uniformly (from about 7.36 GHz to about 7.32 GHz) around 7.34 GHz in a bias voltage range of 114 mV to 142 mV.

The MR element has a low tunnel resistance (having a RA value of 2 $\Omega/\mu m^2$ or lower), and therefore, an operating voltage for high-frequency oscillation is about 130 mV which is extremely low. Therefore, by using this MR element, a high-frequency phase-locked oscillation circuit with a less power consumption is achieved.

Figure 9:
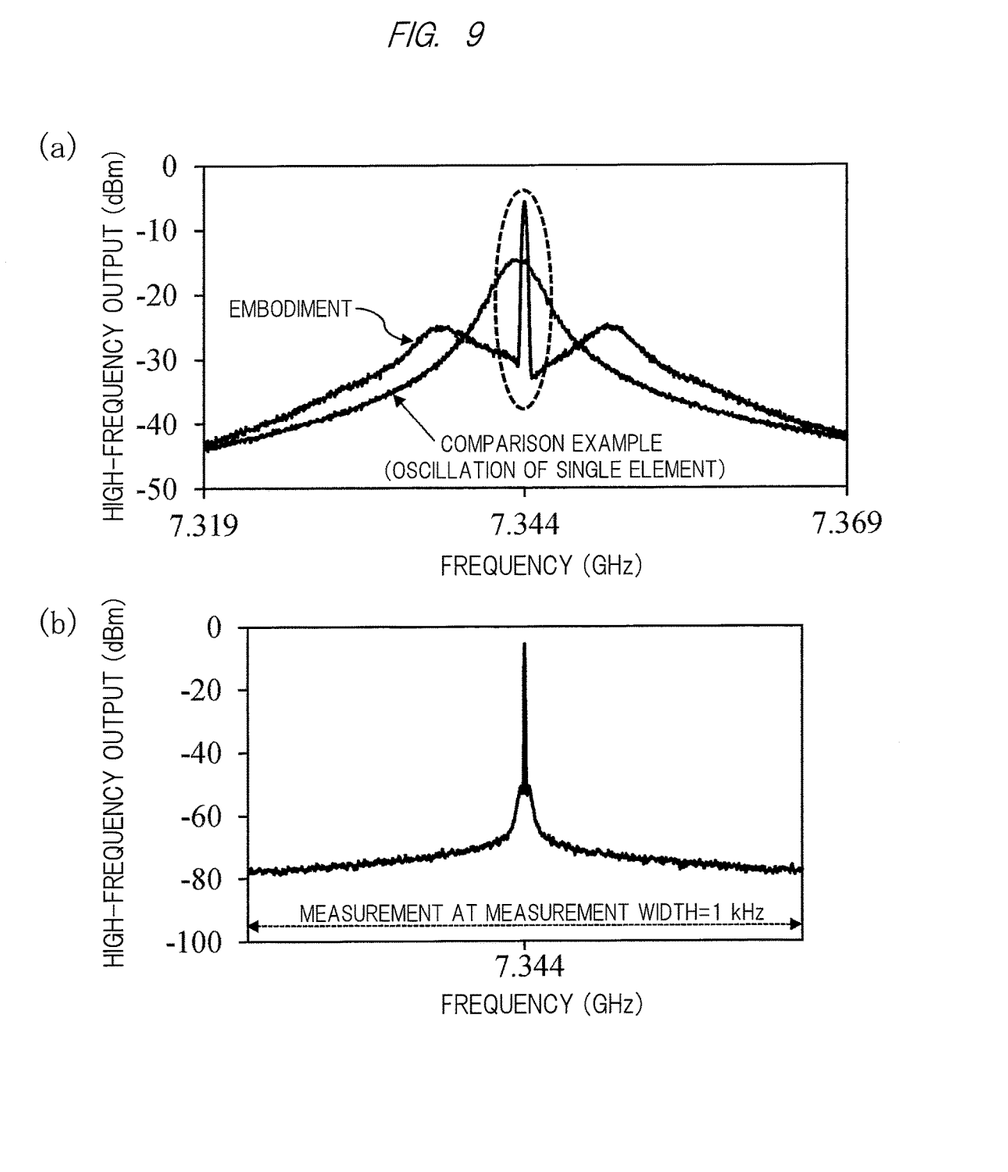
FIG. 9 is a diagram showing oscillation spectra of a high-frequency wave according to each of the first embodiment and a comparison example, and (b) is a partially enlarged diagram of (a) showing the first embodiment.

FIG. 9 shows a result obtained by operating the high-frequency phase-locked oscillation circuit of FIG. 3 to generate the high-frequency oscillation using the MR element having the characteristics of FIGS. 6 to 8. FIG. 9(*b*) is a partially enlarged diagram of FIG. 9(*a*). In an embodiment, phase synchronization of the oscillating frequency $f_{out}$ of 7.344 GHz is achieved by the PLL circuit having the frequency divider with a frequency division ratio of 48 and using a reference signal of 153 MHz from a crystal oscillator. As shown in FIG. 9, in a (element oscillation) comparison example in which the oscillation is generated by only the element without operating the PLL circuit, a peak width is about 4 MHz which is large. On the other hand, in the present embodiment, after the phases are synchronized by operating the PLL circuit, the peak width becomes a measurement limit or smaller. According to the enlarged diagram (b) of FIG. 9, it has been found that the peak width after the phases are synchronized is 1 Hz or lower which is extremely small from the result of measurement in a narrow measurement range (measurement width of 1 KHz).

Figure 10:
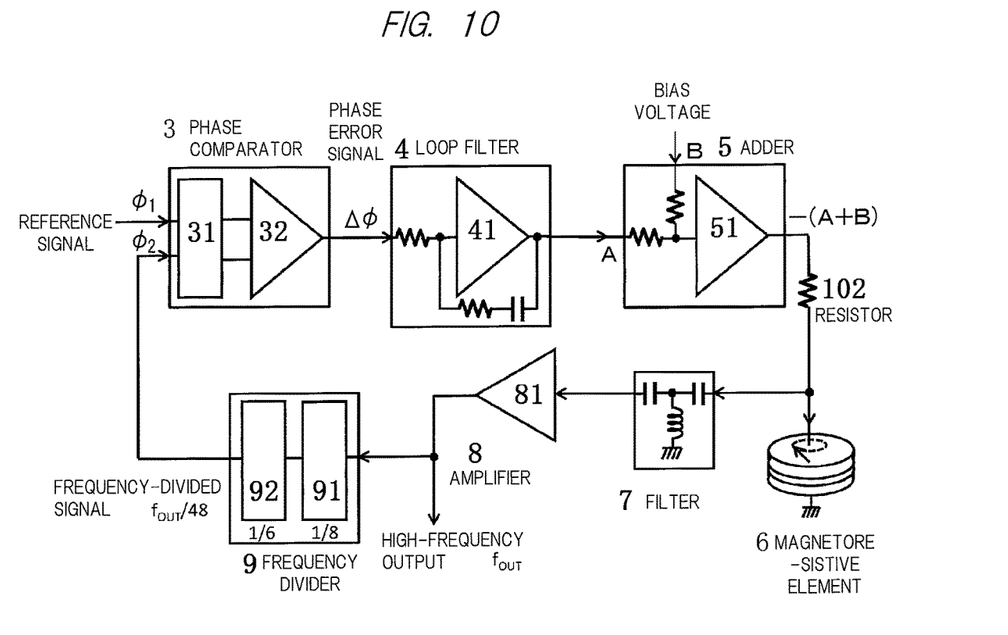
FIG. 10 is a circuit diagram according to the first embodiment that shows FIG. 1 in detail.

FIG. 10 shows a detailed example of the circuit diagram shown in FIG. 1. The bias voltage (A+B) is applied to the magnetoresistive element 6 via a resistor 102 to excite microwave oscillation. This microwave is blocked by the resistor 102, and therefore does not travel toward the adder 5 but flows to the filter 7. As the filter 7, a T-type filter composed of one inductor and two capacitors has been used. A cutoff frequency of the filter is about 1 GHz as an actual measured value, which is between the frequency ($f_{ref}$) of the reference signal that is 153 MHz and the oscillation frequency ($f_{out}$) 7.34 GHz.

As the amplifier 8, a wide-band/low-noise amplifier 81 (BZ-00101600-221040-252020 produced by B&Z Technologies company) has been used, the wide-band/low-noise amplifier having an amplification factor of about 42 dB in vicinity of an STO oscillation frequency, having a noise figure of 2.1 dB, and having an operating band of 100 MHz to 16 GHz. As the frequency divider, a frequency divider having a frequency division ratio "N=48" has been configured by combining a frequency divider 91 (Model 5650 produced by Picosecond Pulse Labs company) whose frequency division ratio is fixed to 8 and a frequency divider 92 (ECL synchronous counter MC100EP160A produced by Onsemi company) whose frequency division ratio is variable while being set to 6. As the phase comparator, an ECL phase comparator 31 (ECL phase comparator MC100EP140 produced by Onsemi company) and a high-speed operational amplifier 32 (high-speed operational amplifier THS4271D produced by Texas Instruments (TI) company) have been used. As the loop filter, a PI control circuit with a proportionality constant of 11 and an integration time constant of 18.3 ns has been configured by using a high-speed operational amplifier 41 (high-speed operational amplifier OPA699 produced by TI), two resistances, and one capacitor. As the adder, an inverting adder has been configured by using a high-speed operational amplifier 51 (high-speed operational amplifier THS4031 produced by TI).

Figure 11:
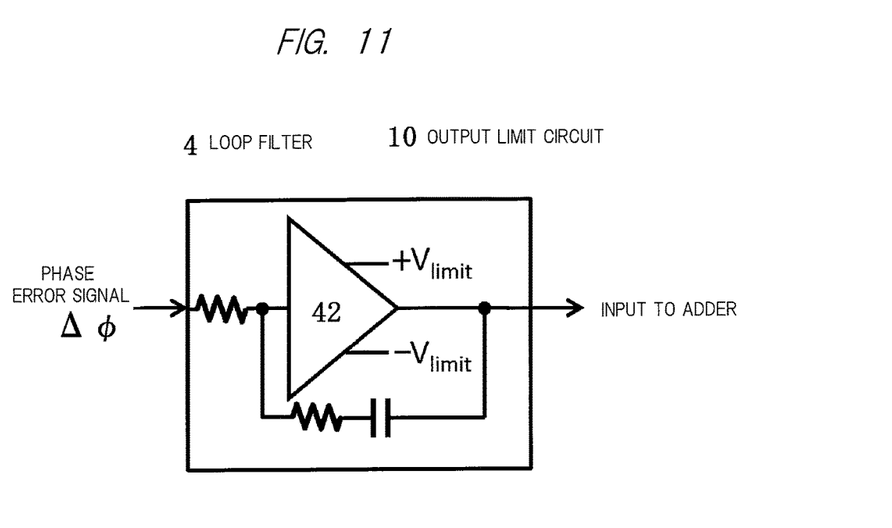
FIG. 11 is a circuit diagram according to the first embodiment that shows an output limit circuit of FIG. 3 in detail.

FIG. 11 is a detailed diagram with only an output limit circuit in the circuit diagram shown in FIG. 3. Other components are omitted because of being the same as those of FIG. 10. Since the critical voltage in the MR element used in the present embodiment is 95 mV, it is desirable to set the lower limit of the output limit circuit to 95 mV or higher.

As the output limit circuit, the output voltage limit function of the high-speed operational amplifier 41 used for the loop filter has been used. At this time, an output of a high-speed operational amplifier 42 (high-speed operational amplifier OPA699 produced by TI) is limited to ±250 mV. This output voltage (A) corresponding to a phase error signal is added to the bias voltage (B) at the adder, and then, is applied to the MR element via a resistor 102 with 200Ω. Since the resistance of the MR element used in the present embodiment is 11Ω, the output voltage corresponding to the phase error signal is divided by using the ratio with respect to 200Ω (11/200=0.05, i.e., 5-times attenuation), and the adjusted voltage (A) added to the bias voltage (B) is consequently limited to a voltage range of ±13.75 mV. Since the median of the operating voltage of the MR element of the present embodiment is about 128 mV (see FIG. 7), the bias voltage during the phase synchronization operation is limited to a range of 115 mV to 141 mV by the above-described output limit circuit.

Since the purpose of usage of the output limit circuit is to limit the bias voltage (A+B) within the operating voltage range of the MR element, a setting position of the output limit circuit may be at a later stage of the adder.

When it is desirable to change the oscillating frequency ($f_{out}$) to be used, note that, for example, the frequency division ratio may be changed.

When an examination without the filter in the circuit of FIG. 3 has been made for comparison, the phase error signal has flown into the frequency divider, which has resulted in malfunction of the frequency divider. Therefore, the phase synchronization has not been normally performed. The peak width of the oscillated high-frequency wave has been larger than that of only the MR element (see the comparison example of FIG. 9($a$)), and the oscillating frequency ($f_{out}$) has shifted to a higher side than that of the embodiment (7.34 GHz).

Second Embodiment

In the present embodiment, explanation will be made with reference to FIGS. 9, 12, and 13. The present embodiment is obtained by improving the first embodiment.

In the first embodiment, it has been confirmed that the phase-locked oscillation circuit operates normally to reduce the peak width of the MR element to 1 Hz or lower as shown in FIG. 9. Still, it is preferable to achieve a higher performance. Specifically, when spectrum distribution existing on both sides of the peak in the oscillation spectrum during the phase synchronization shown in FIG. 9($a$) shows phase noises, the lower phase noises are preferable. This oscillation spectrum has two wide peaks at points that are distant rightward and leftward from the spectrum center by 8 MHz, respectively. This is because the band (while this means the band width, this is usually expressed as its upper limit value) of the phase-locked oscillation circuit is about 8 MHz. That is, although phase noises of 0- to 8-MHz frequency components are suppressed, phase noises conversely increase in vicinity of 8 MHz, and are higher than phase noises in the comparison example. FIG. 9($a$) shows that the phase noises at frequencies in vicinity of 8 MHz and higher than 8 MHz (directed to be distant from the peak) are not suppressed by the phase-locked oscillation circuit of the first embodiment.

Accordingly, in order to suppress the phase noises at a higher band, an increase in the operation speed of the phase-locked oscillation circuit has been attempted in the present embodiment. The phase noises at the higher band means high-speed fluctuations of the oscillation frequency of the MR element. In order to solve this high-speed fluctuation problem, it is required to increase a signal transmission speed (reduce delay time) first. FIG. 12 shows a circuit diagram in this case. In FIG. 12, the following improvements (1), (2), and (3) have been implemented in comparison with the circuit of FIG. 10.

(1) As the frequency divider 9, in the first embodiment, the ⅛ frequency divider 91 and the ⅙ frequency divider 92 have been combined together and been used as shown in FIG. 10. On the other hand, in the present embodiment, the frequency dividers have been collected into one by using a frequency divider 93 (e.g., UXN14M32K produced by Microsemi company) that is operable up to 15 GHz and that has a variable frequency division ratio as shown in FIG. 12.

(2) In the phase comparator 3 of the first embodiment, two outputs exist in the ECL phase comparator 31, and are output to a differential amplifying circuit using the high-speed operational amplifier 32 so that the two outputs are collected into one as shown in FIG. 10 since the following loop filter is a single input circuit. On the other hand, in the present embodiment, two output terminals of an ECL phase comparator 33 (ECL phase comparator MC100EP140 produced by Onsemi company) serving as the phase comparator 3 have been directly input to the loop filter 4 as shown in FIG. 12. This is because it is not required to interpose the differential amplifying circuit by changing the loop filter 4 to have a differential input type circuit configuration.

(3) As the adder 5, in the first embodiment, the inverting adder using the operational amplifier has been used as shown in FIG. 10. On the other hand, in the present embodiment, the adder has been changed into an adder 5 using a resistance network as shown in FIG. 12.

As described above in the improvements (1), (2), and (3), the operation speed of the circuit has been increased by reducing the delay time in the signal transmission that has caused in the circuit of the first embodiment so as to focus on the factors as less as possible.

Figure 12:
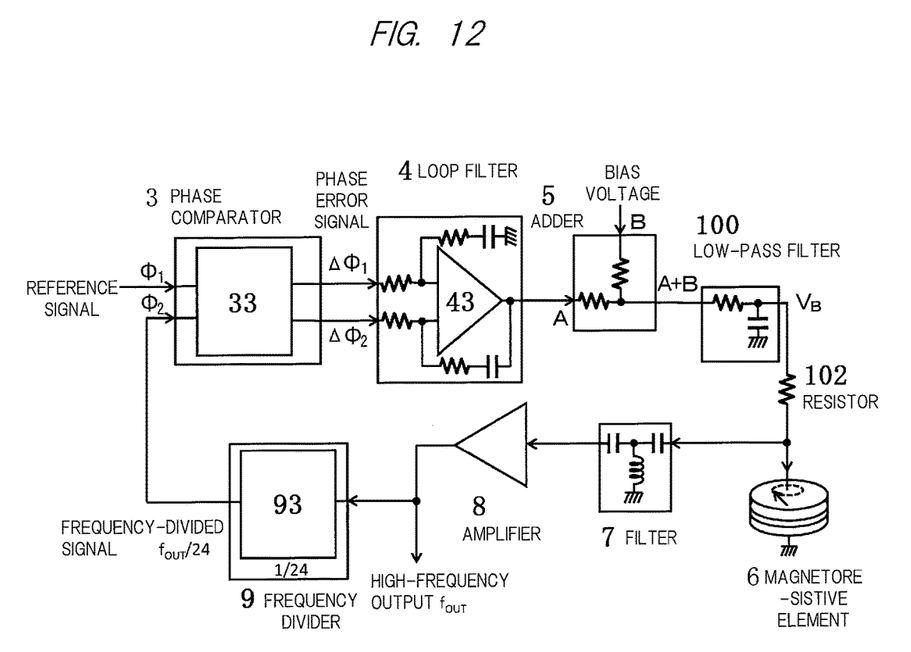
FIG. 12 is a circuit diagram according to a second embodiment.

Further, the circuit of FIG. 12 can be further improved by providing a low-pass filter 100. The function of the low-pass filter 100 will be described in detail below.

Figure 13:
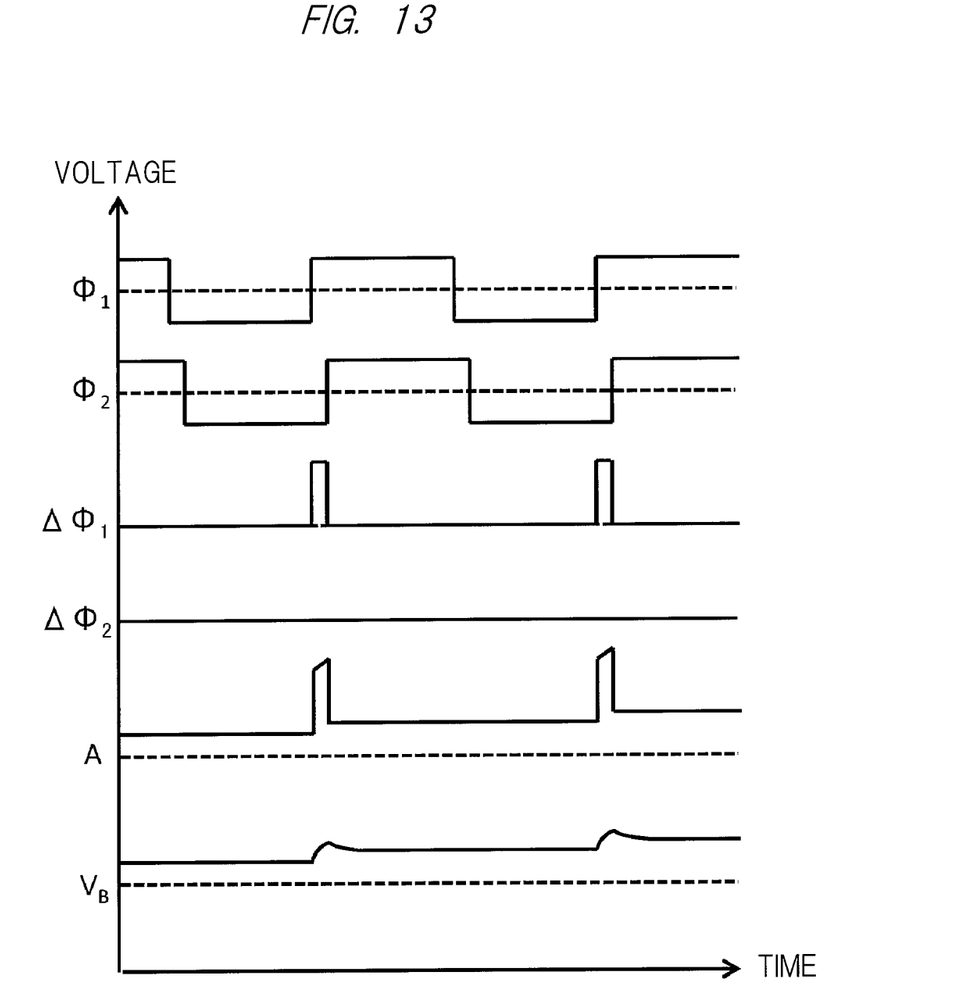
FIG. 13 is a diagram for explaining signals in the circuit diagram according to the second embodiment.

FIG. 13 is a graph for explaining signals in the circuit of FIG. 12. In FIG. 13, "$\phi_1$" represents a waveform of the reference signal, and "$\phi_2$" represents a waveform of a frequency-divided signal created by frequency division of an oscillation signal from the MR element (which is referred to also as STO). In FIG. 13, the phase of the frequency-divided signal $\phi_2$ is delayed, and therefore, glitch-like signals are caused in a $\Delta\phi_1$ signal waveform. If the phase of the frequency-divided signal $\phi_2$ is advanced, glitch-like signals are caused in a $\Delta\phi_2$ signal waveform. These glitch-like signals pass the loop filter 4 without attenuating, and are added to the bias voltage used for driving the MR element. As a result, the drive signal $V_B$ rapidly rises and drops. Therefore, the oscillation is significantly disturbed, which results in a problem of a failure in the phase synchronization. In order to solve this problem in the circuit of FIG. 12, the low-pass filter 100 has been additionally provided at a stage after the adder 5. As a result, the glitch-like signals are smoothed (see $V_B$ of FIG. 13), the oscillation of the MR element is not disturbed, and therefore, the more stable phase synchronization can be achieved.

The band of the phase-locked oscillation circuit has been increased to 16 MHz by such improvements as increasing the operation speed of the circuit and adding the low-pass filter 100 to smooth the bias voltage $V_B$. This is about two times (16/8) as high as that of the first embodiment. And, a total intensity of residual phase noises has been dropped down to about ¼.

Third Embodiment

The present embodiment will be described with reference to FIG. 14. The present embodiment is obtained by improving the embodiments 1 and 2.

In the phase-locked oscillation circuits of the first embodiment (FIGS. 1 and 10) and the second embodiment (FIG. 12), a high-frequency signal generated by the oscillating MR element has a small amplitude, and therefore, the high-frequency signal has been amplified by the amplifier 8 (BZ-00101600-221040-252020 produced by B&Z Technologies company) before being sent to the frequency divider. In this case, when the noises that have been generated by the amplifier 8 and added to the high-frequency signal is frequency-divided by the frequency divider 9, the present inventors have found out that the noises become a cause of random time shift, i.e., jitter.

The present inventors have also found that, when the signal-to-noise ratio (SN ratio) of the high-frequency signal is insufficient, the noises cause malfunction of the frequency divider 9, which results in a problem of a failure in the phase synchronization operation.

Figure 14:
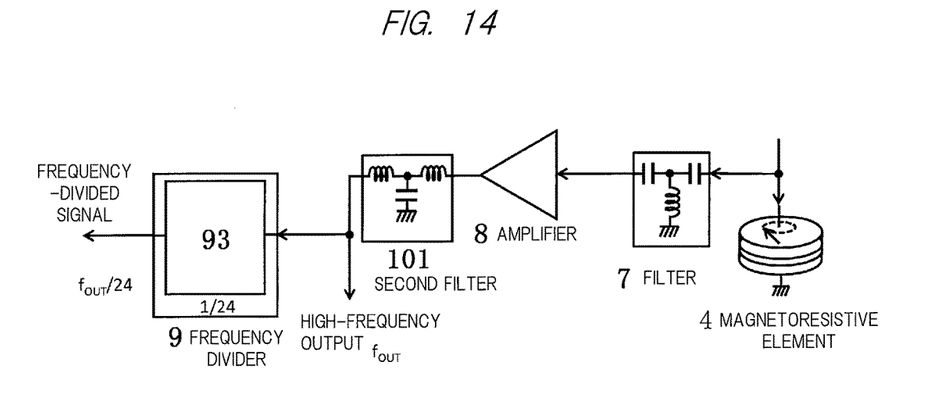
FIG. 14 is a circuit diagram according to a third embodiment.

In order to solve these problems, the present inventors have provided a filter 101 (second filter) between the amplifier 8 and the frequency divider 9 as shown in FIG. 14 so that only the high-frequency signal generated by the MR element is passed while the noises in other frequency bands are removed by the filter. As a result, the frequency divider has normally operated by even a high-frequency signal with an about half amplitude of a high-frequency signal in the case without the filter 101. And, at the same time, the jitter caused by the noise created by the amplifier has been significantly reduced. Note that the filter 101 in FIG. 14 is referred to also as second filter in order to distinguish it from the filter 7 that is provided in a region closer to the output side of the magnetoresistive element and that cuts off the reference frequency $f_{ref}$ but passes the oscillating frequency $f_{out}$.

Examples of the embodiments described above have been described for understanding the invention, and the invention is not limited to these embodiments.

While the present disclosure has been illustrated and described with respect to a particular embodiment thereof, it should be appreciated by those of ordinary skill in the art that various modifications to this disclosure may be made without departing from the spirit and scope of the present disclosure.

The invention claimed is:

1. A high-frequency phase-locked oscillation circuit comprising:
   a magnetoresistive element that oscillates a high-frequency wave with an oscillating frequency $f_{out}$;
   a reference signal source that outputs a reference signal with a reference frequency $f_{ref}$; and
   a phase-locked loop circuit having a phase comparator, a loop filter, and a frequency divider,
   wherein the high-frequency phase-locked oscillation circuit further includes:
   an adder that adds a voltage A output from the loop filter and corresponding to a phase error signal and a bias voltage B for oscillating the high-frequency wave from the magnetoresistive element, and that inputs an added bias voltage (A+B) to the magnetoresistive element; and
   a filter provided between the frequency divider and the magnetoresistive element, the filter cutting off the reference frequency L while allowing the oscillating frequency $f_{out}$ to pass through the filter.

2. The high-frequency phase-locked oscillation circuit according to claim 1, wherein the oscillating frequency $f_{out}$ is a fundamental wave fMR or high harmonic wave with a oscillation frequency of the magnetoresistive element.

3. The high-frequency phase-locked oscillation circuit according to claim 1, wherein the filter cuts off a fundamental wave and high harmonic wave with the reference frequency $f_{ref}$.

4. The high-frequency phase-locked oscillation circuit according to claim 1, wherein an output limit circuit is provided in a region closer, in an electrical layout context, to an output side of the loop filter or to an output side of the adder.

5. The high-frequency phase-locked oscillation circuit according to claim 1, wherein a low-pass filter is provided in a region closer, in an electrical layout context, to an output side of the adder, the region being also closer, in an electrical layout context, to an input side of the magnetoresistive element.

6. The high-frequency phase-locked oscillation circuit according to claim 1,
   wherein an amplifier is provided for amplifying a high-frequency signal oscillated from the magnetoresistive element before being sent to the frequency divider, and
   a second filter, that allows only the oscillation frequency $f_{out}$ oscillated from the magnetoresistive element to pass through the filter, is provided between a region closer, in an electrical layout context, to an output side of the amplifier and a region closer, in an electrical layout context, to an input side of the frequency divider.

* * * * *